United States Patent
Braun et al.

(10) Patent No.: US 7,532,523 B2
(45) Date of Patent: May 12, 2009

(54) MEMORY CHIP WITH SETTABLE TERMINATION RESISTANCE CIRCUIT

(75) Inventors: Georg Braun, Holzkirchen (DE);
Christian Weis, Munich (DE);
Eckehard Plaettner, Oberhaching (DE)

(73) Assignee: Qimonda AG, Munich (DE)

( * ) Notice: Subject to any disclaimer, the term of this patent is extended or adjusted under 35 U.S.C. 154(b) by 263 days.

(21) Appl. No.: 11/461,380

(22) Filed: Jul. 31, 2006

(65) Prior Publication Data
US 2007/0035326 A1 Feb. 15, 2007

(30) Foreign Application Priority Data
Jul. 29, 2005 (DE) .................. 10 2005 035 780
Aug. 3, 2005 (DE) .................. 10 2005 036 528

(51) Int. Cl.
*G11C 7/00* (2006.01)
(52) U.S. Cl. .................. 365/194; 326/30; 365/198; 365/206
(58) Field of Classification Search .................. 326/30; 365/51, 189.17, 191, 198, 206, 194
See application file for complete search history.

(56) References Cited

U.S. PATENT DOCUMENTS

| 6,356,106 | B1 * | 3/2002 | Greeff et al. .................. 326/30 |
| 6,762,620 | B2 * | 7/2004 | Jang et al. .................. 326/30 |
| 6,970,369 | B2 * | 11/2005 | Funaba et al. .................. 365/63 |
| 7,148,721 | B2 * | 12/2006 | Park .................. 326/30 |
| 2004/0228196 | A1 | 11/2004 | Kwak et al. | |

OTHER PUBLICATIONS

DDR2 SDRAM Specification, JEDEC Standard No. 79-2A, pp. 6 and 14-22, Jan. 2004.

* cited by examiner

*Primary Examiner*—VanThu Nguyen
*Assistant Examiner*—Alexander Sofocleous
(74) *Attorney, Agent, or Firm*—Patterson & Sheridan, L.L.P.

(57) ABSTRACT

Methods and apparatus for setting various terminations of a memory chip. The memory chip includes a terminal, a termination circuit that can be connected to the terminal in order to terminate the terminal with a settable resistance value, a control command port for receiving a control command signal, and a control circuit that is connected to the termination circuit in order to set a resistance value as a function of a received control command signal.

10 Claims, 5 Drawing Sheets

LEGEND:
1 - MEMORY CHIP
2 - MEMORY CELL ARRAY
3 - LOGIC CIRCUIT
4 - EXTERNAL TERMINAL
5 - TERMINATION CIRCUIT
6 - FIRST SETTABLE TERMINATING RESISTOR
7 - SECOND SETTABLE TERMINATING RESISTOR
8 - CONTROL UNIT
9 - CONFIGURATION UNIT
10 - COMMAND DECODER
11 - EXTERNAL CONTROL COMMAND PORTS
13 - EXTERNAL TERMINATION PORT

FIG 1

LEGEND:

1 - MEMORY CHIP
2 - MEMORY CELL ARRAY
3 - LOGIC CIRCUIT
4 - EXTERNAL TERMINAL
5 - TERMINATION CIRCUIT
6 - FIRST SETTABLE TERMINATING RESISTOR
7 - SECOND SETTABLE TERMINATING RESISTOR
8 - CONTROL UNIT
9 - CONFIGURATION UNIT
10 - COMMAND DECODER
11 - EXTERNAL CONTROL COMMAND PORTS
13 - EXTERNAL TERMINATION PORT

FIG 2

LEGEND:

1 - MEMORY CHIP
2 - MEMORY CELL ARRAY
3 - LOGIC CIRCUIT
4 - EXTERNAL TERMINAL
5 - TERMINATION CIRCUIT
6 - FIRST SETTABLE TERMINATING RESISTOR
8 - CONTROL UNIT
9 - CONFIGURATION UNIT
10 - COMMAND DECODER
11 - EXTERNAL CONTROL COMMAND PORTS
12 - MULTIPLEXER
13 - EXTERNAL TERMINATION PORT
15 - SETTING UNIT

MEMORY CHIP WITH SETTABLE TERMINATION RESISTANCE CIRCUIT

CROSS-REFERENCE TO RELATED APPLICATIONS

This application claims foreign priority benefits under 35 U.S.C. §119 to co-pending German patent application number DE 10 2005 035 780.6, filed 29 Jul. 2005. This application also claims foreign priority benefits under 35 U.S.C. §119 to co-pending German patent application number DE 10 2005 036 528.0, filed 3 Aug. 2005. Each of these related patent applications is herein incorporated by reference in its entirety.

BACKGROUND OF THE INVENTION

1. Field of the Invention

The following description relates to a memory chip having a terminal for sending and/or receiving high-frequency signals. The description further relates to a method for operating a memory chip.

2. Description of the Related Art

In memory systems, use is normally made of a multiplicity of memory chips that are operated via a memory bus. Control command signals, clock signals, data signals and address signals are generally connected to the memory chips via the memory bus. The memory bus comprises signal lines that normally connect the memory chips to one another and to a memory controller. However, during transmission of high-frequency signals, signal reflections that disturb the data transmission on the memory bus and thereby limit the data transmission rates can occur at the terminals of the memory chips. It is necessary for this reason when transmitting data via the memory bus to provide suitable terminations at the terminals of the memory chips in order to reduce the signal reflections on the signal lines.

It has previously been provided in the case of memory chips to switch the termination on or off at a terminal of the memory chip as a function of a termination signal. That is to say, the memory controller makes a suitable termination signal available to each of the memory chips in order to support the following read, write or other operation onto the memory chips with an optimal termination at all the memory chips connected to the memory bus. The disadvantage of such a control of the memory chips consists in that switching the terminating resistors on and off is not sufficient as a rule to achieve an optimal termination in every operating state, and thus, also not sufficient to improve the data transmission via the memory bus.

Furthermore, it can be provided that the strength of the terminating resistors in the memory chips is fixed in accordance with a configuration value that is communicated to the memory chips by the memory controller in an initialization phase at the beginning of the operation of the memory system. Setting the configuration values in the memory chips before each write and read operation is time consuming. Consequently, the initial presetting of the terminating resistor by the configuration value is also not suitable for providing terminating resistors for applying to the memory bus that are suitable for every case of addressing the memory chips of the memory system, since the access time in the memory system would thereby be slowed down substantially.

SUMMARY OF THE INVENTION

According to a one aspect, a memory chip is provided for setting various terminations on a signal line of the data bus. The memory chip comprises a terminal, a termination circuit which is connectable to the terminal in order to terminate the terminal with a settable resistance value, a control command port for receiving a control command signal, and a control circuit that is connected to the termination circuit in order to set the resistance value as a function of a received control command signal and to make the resistance value available at the terminal.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
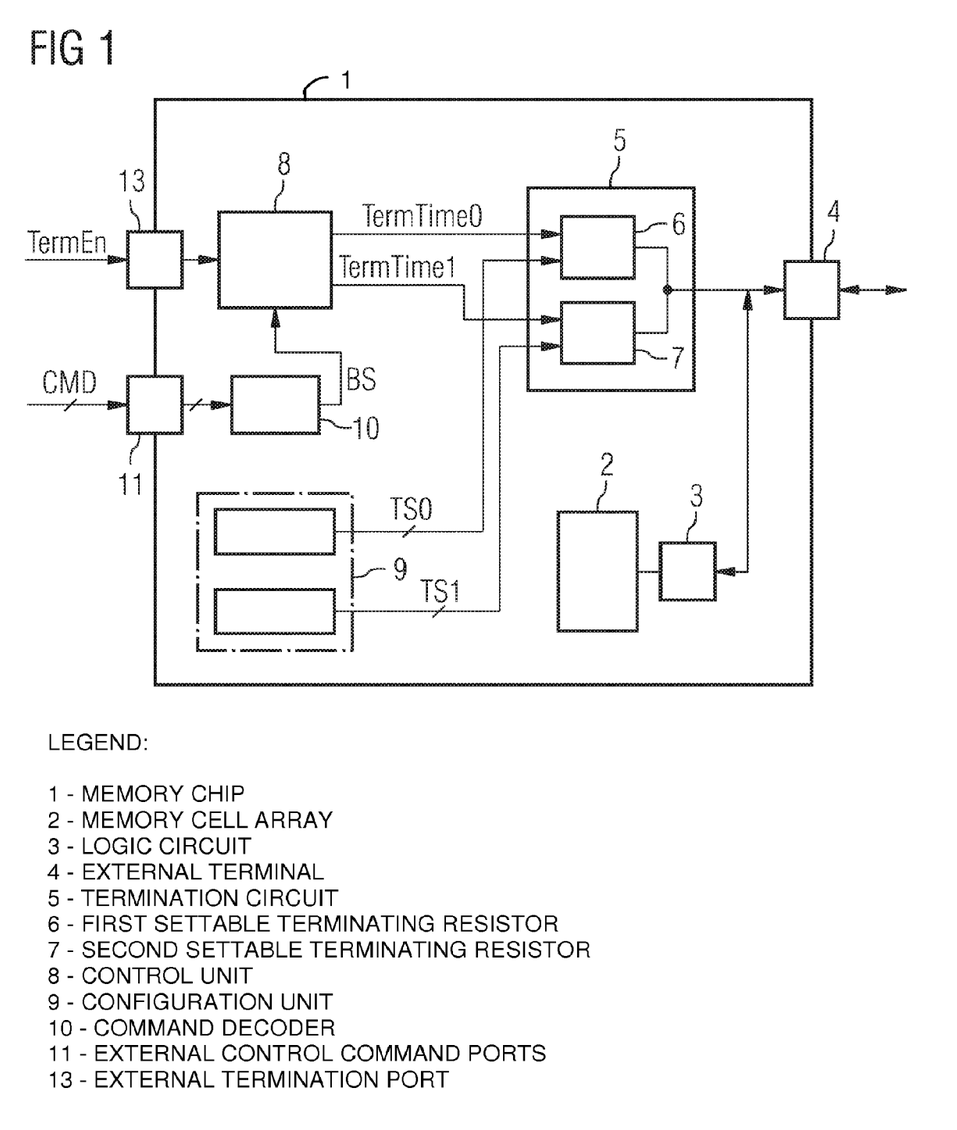
FIG. 1 shows a block diagram of a memory chip in accordance with a first embodiment.

A memory chip 1 is illustrated in FIG. 1 as a block diagram. The memory chip 1 comprises a memory cell array 2, such as, for example, a DRAM memory cell array, that can be written to and read from via a logic circuit 3. The logic circuit 3 comprises driver circuits as well as input amplifiers and output drivers (not shown). The logic circuit 3 is connected to an external terminal 4 of the memory chip 1 via which, for example, address, clock and user data can be read in or driven out.

The external terminal 4 is connected to a termination circuit 5 that has a first settable terminating resistor 6 with a first resistance value, and a second settable terminating resistor 7 with a second resistance value. The termination circuit 5 is connected to a control unit 8 that makes available to the termination circuit 5 a first control signal TermTime0, and a second control signal TermTime1. Upon activation of the first control signal TermTime0, the first terminating resistor 6 is connected to the external terminal 4 such that the external terminal 4 is terminated with the first resistance value set accordingly in the first terminating resistor 6. Upon activation of the second control signal TermTime1, the second terminating resistor 7 is correspondingly connected to the first terminal such that the external terminal 4 is terminated with the second resistance value. Furthermore, given simultaneous activation of the two control signals TermTime0, TermTime1, it is also possible to generate a further resistance value for termination that results from the parallel connection of the first and second resistance values.

Further provided is a configuration unit 9 that makes available a first configuration value TS0 and a second configuration value TS1. The first configuration value TS0 is connected to the first terminating resistor 6, and the second configuration value is connected to the second terminating resistor 7 in order to set the respective resistance value of the corresponding terminating resistor 6, 7. The configuration values TS0, TS1 can be made available in parallel via configuration signals. As a function of the respective control signal TermTime0, TermTime1, the corresponding terminating resistor 6, 7, whose resistance value is provided by the respective configuration value TS0, TS1, is then connected to the external terminal 4.

A settable terminating resistor can be achieved, for example, by switchable, parallel-connected resistors. It is also possible to implement the resistors by means of transistors with the same or different channel width that are completely or partially switched through. The terminating resistors can be fashioned such that the respective control signal TermTime0, TermTime1 is logically combined with each of the bits of the configuration value TS0, TS1 made available by means of AND operation, and the respective logic results are connected to the inputs of transistors provided in the terminating resistor.

Via an external termination port 13, the control unit 8 receives a termination enable signal TermEn that indicates whether or not a termination is to be provided at the external terminal 4. That is to say, via the first and the second control signal TermTime0, TermTime1, the respective terminating resistor 6, 7 is connected to the external terminal 4 only when the termination signal TermEn specifies that there is to be a termination. Otherwise, no termination of the external terminal 4 is undertaken.

Which of the two terminating resistors 6, 7 is connected to the external terminal 4 is specified as a function of a command signal BS that is made available by a command decoder 10, as a function of a received control command CMD. Via one or more external control command ports 11, the command decoder 10 receives control command signals CMD for activating, addressing and/or driving the memory chip 1.

The control command signals CMD can assume an active or inactive state. If the memory chip 1 is a DRAM memory chip, the control command signals can be, for example, the chip select signal CS for selecting the relevant memory chip for a specific operation, the write enable signal WE for enabling a write access to the memory chip, the RAS signal (row activation signal) for transmitting the word line address and for activating the word line, as well as the CAS signal (column activation signal) for transmitting the bit line address and for activating the bit line for reading data out and/or writing them into the memory cell field. Depending on whether the relevant memory chip in a memory system is or is not selected for an operation, or whether the aim is to carry out writing or reading on the relevant memory chip (write enable signal), only one of the two terminating resistors 6, 7 or none of the two terminating resistors can be selected (under the control of the termination signal) in order to terminate the external terminal 4 in a suitable way.

Figure 2:
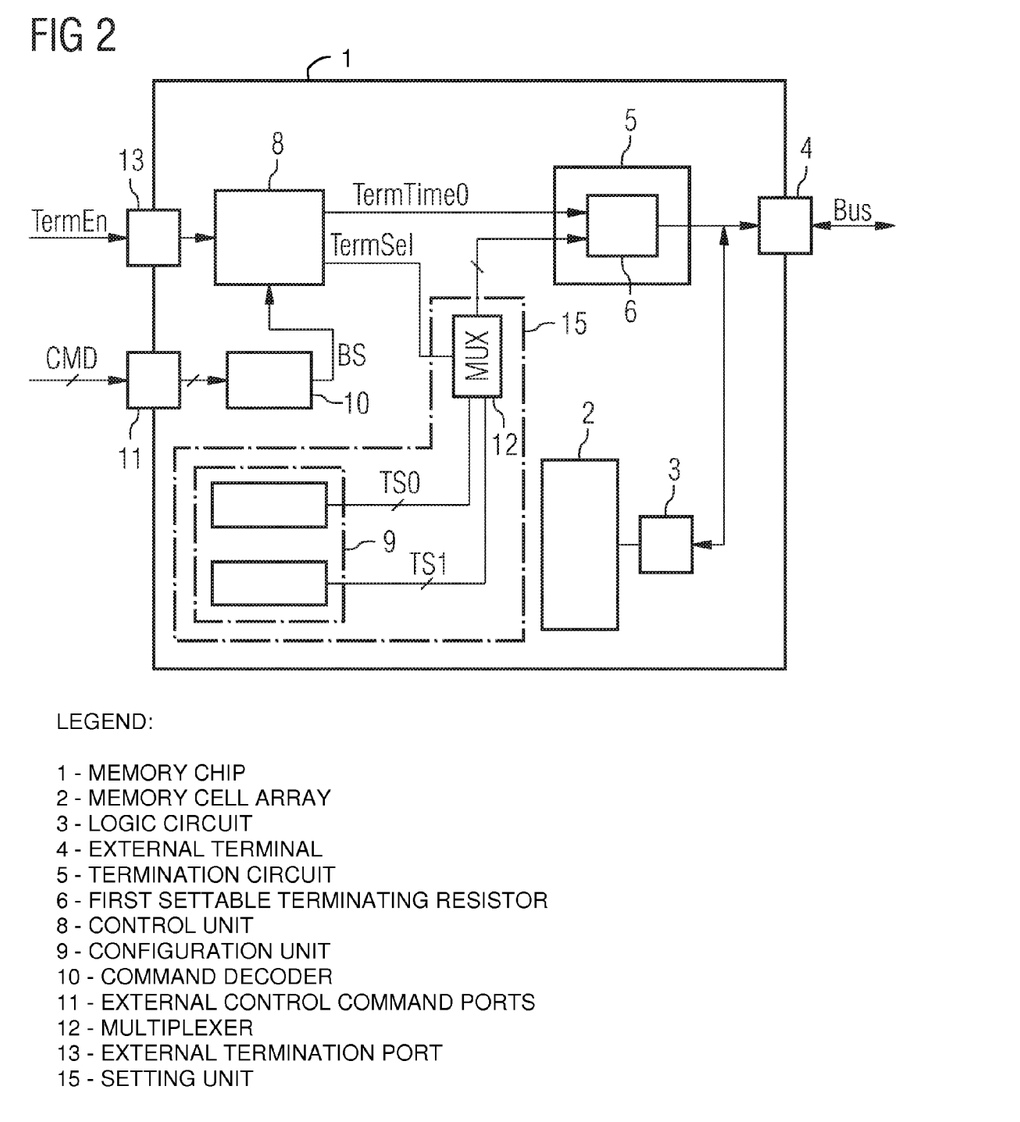
FIG. 2 shows a block diagram of a memory chip in accordance with a further embodiment.

FIG. 2 shows another embodiment of a memory chip 1. Like functions or components relative to FIG. 1 are identified by like reference numbers or labels. The embodiment of FIG. 2 differs from the embodiment of FIG. 1 in that a setting unit 15 is provided that has the configuration unit 9 and a multiplexer 12. A termination selection signal TermSel made available by the control unit 8 is connected to a control input of the multiplexer 12. The termination selection signal TermSel is used to select which of the configuration values TS0, TS1 made available by the configuration unit 9 is connected to the termination circuit 5. In this embodiment, the termination circuit 5 comprises only one settable terminating resistor 6 whose resistance value is set as a function of the selected configuration value TS0, TS1. The sole terminating resistor 6 is now activated or deactivated, and thereby connected to the external terminal 4 or not as a function of the single control signal TermTime0, which is made available by the control unit 8.

The magnitude of the resistance value of the terminating resistor 6 is determined by the termination selection signal TermSel with the aid of which one of the configuration values TS0, TS1 is selected. By contrast with the embodiment of FIG. 1, it is possible in the case of this embodiment to dispense with a second settable terminating resistor and instead of this to select the single settable terminating resistor in accordance with a configuration value that can be selected via the multiplexer 12, doing so as a function of the current control command signals. A combination of various terminating resistors that are simultaneously connected to the external terminal 4, as shown in FIG. 1, is therefore not possible, but chip area can be saved since only one settable terminating resistor 6 is required.

Figure 3:
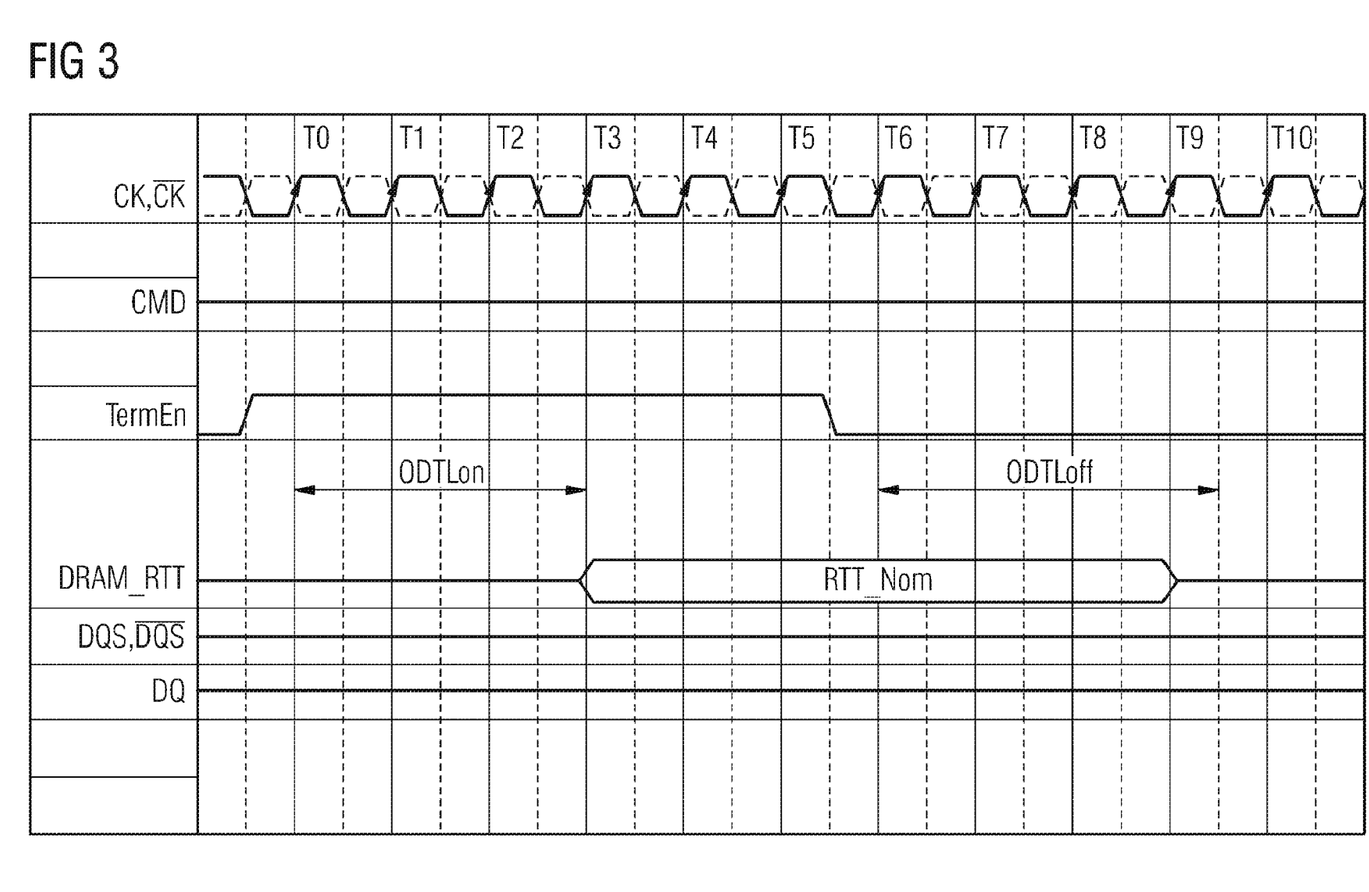
FIG. 3 shows a signal-time diagram that illustrates the functionality of the embodiments of FIG. 1 and FIG. 2 given the presence of no operation affecting the memory chip.

FIG. 3 shows a signal-time diagram for explaining the signal profile for setting the termination in an inventive memory chip. Specified in the signal-time diagram of FIG. 3 is a case where the goal is to switch on a termination when the command control signal specifies that the relevant memory chip is not activated, that is to say no access to the memory chip is to be carried out (chip select signal deactivated). After a predetermined termination switch-on time ODTLon of, in this example, three clock periods, a desired first resistance value RTT_Nom (DRAM_RTT) is connected to the external terminal 4 in a fashion triggered by the activation of the termination signal TermEn by the memory controller and by a rising edge of a clock signal CK at an instant T0. After deactivation of the termination signal TermEn during the fifth clock period T5, the next rising edge of the clock signal T6 starts a predetermined termination switch-off time ODTLoff that amounts in this exemplary embodiment to three and a half clock periods, and after the elapse thereof the terminating resistor is disconnected from the external terminal 4. The time durations of the termination switch-on time ODTLon and of the termination switch-off time ODTLoff can be selected as desired, and should be selected such that they suffice to connect the terminating resistor reliably to the external terminal 4, or to disconnect it therefrom. That is to say, they should at least have the time duration required for switching a terminating resistor on or off, or for connecting and disconnecting the terminating resistor from the external terminal 4.

For example, given a deactivated chip select signal, that is to say when no operation is to be carried out in the memory chip, it is possible for the termination of the external terminal 4 to be undertaken or not, and this is controlled in a memory system by the memory controller issuing the termination signal TermEn. At the same time, it is established by the decoder 10 of the memory chip that the chip select signal CS is deactivated and as a function of the chip select signal CS an appropriate configuration value or control signal (according to the particular embodiment) is connected to the termination circuit 5 in order to connect the selected terminating resistor 6, 7 (FIG. 1) or 6 (FIG. 2) to the external terminal 4, doing so as a function of the termination signal TermEn.

Figure 4:
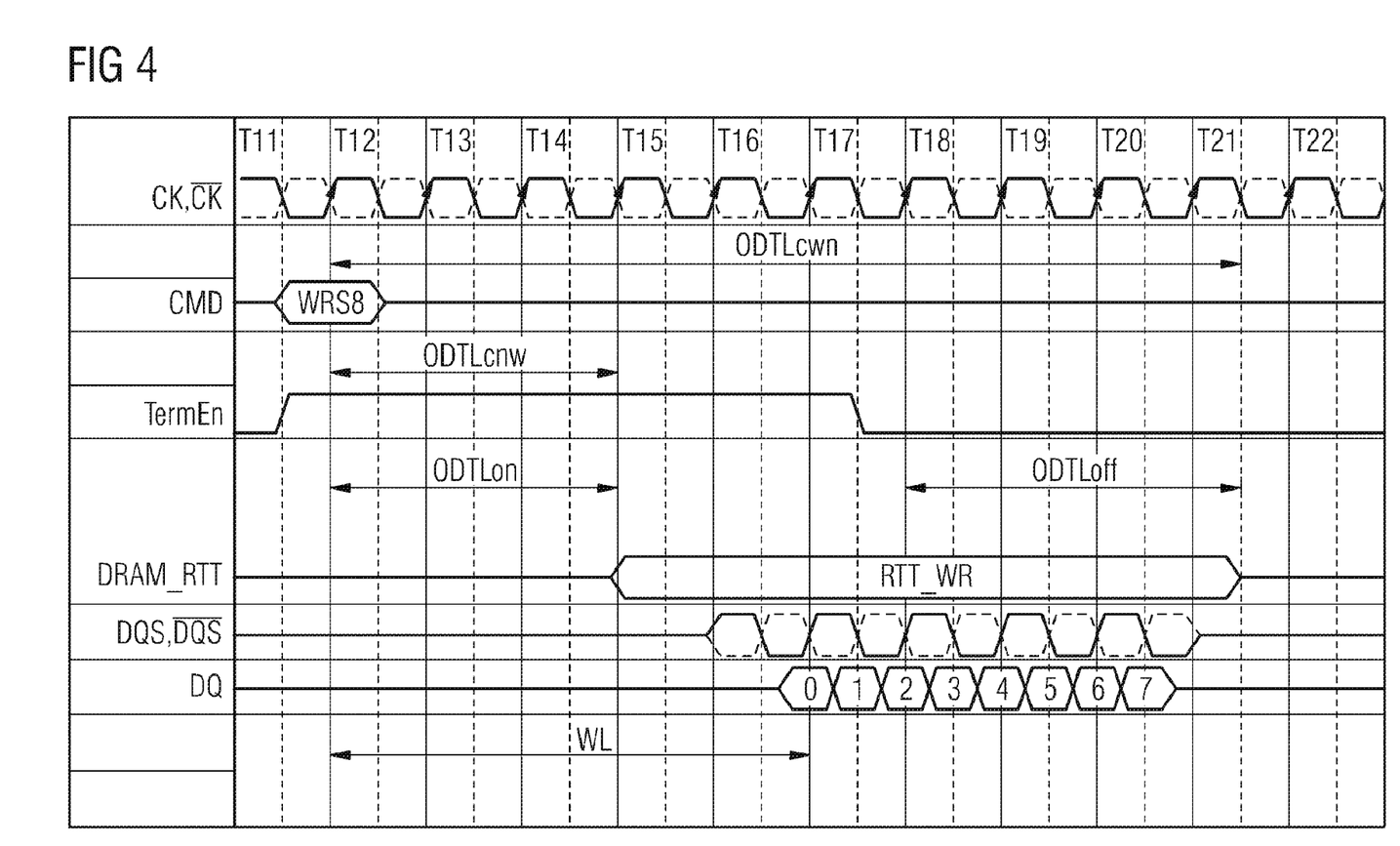
FIG. 4 shows a signal-time diagram for illustrating the functionality of the embodiments of FIGS. 1 and 2 that illustrates the carrying out of a write operation.

FIG. 4 illustrates a further signal-time diagram for the embodiment of FIGS. 1 and 2. The signal-time diagram of FIG. 4 exhibits a case in which the corresponding memory chip is activated by the chip select signal CS, and a write command (WE-Signal) WRS8 is sent to the memory chip by the memory controller. The memory controller may assert the termination signal TermEn and the write signal WRS8 such that they can be accepted into the memory chip by a rising clock edge at an instant T12. The command decoder decodes the write signal WRS8 and generates the command signal BS, which is applied to the control unit 8. Depending on the command signal BS, it is established in the control unit 8 that it is now necessary to connect to the external terminal 4 a terminating resistor that is determined by the second configuration value. In the case of the embodiment of FIG. 1, the control unit 8 therefore activates the second control signal TermTime1 in order to activate the second terminating resistor 7. In the embodiment of FIG. 2, the control unit 8 switches the termination selection signal TermSel such that the multiplexer 12 connects the second configuration value to the termination circuit 5 in order to set there the resistance value of the terminating resistor 6 to the corresponding value, in this case to a second resistance value RTT_WR that corresponds to the terminating resistor that is to be connected to the activated memory chips in the event of a write access to the external terminal 4.

Depending on the termination signal TermEn the terminating resistor is now connected to the external terminal 4 after the termination switch-on time ODTLon, the terminating resistor now being a different one, depending on the control command signal, as previously in the case of the deactivated memory chip (FIG. 3). The write latency time duration WL, which amounts to 5 clock periods in the exemplary embodiments shown, begins to run at the same time as the reception of the write command WRS8. The data strobe signal DQS can be read into the memory chip at the same time as the data in terms of one clock period before the transmission of a data burst, that is to say transmission of 8 data bits. The termination switch-on time ODTLon may be selected to be equal to or less than the write latency time duration WL in order to ensure that the desired terminating resistor is connected to the external terminal 4 during transmission of data to the memory chip (during write access).

In general, the command signal BS is generated in the command decoder 10 such that it specifies to the control unit 8 which resistance value, RTT_Nom or RTT_WR, is to be set as terminating resistor for the terminal. In the case of a first group of control commands CMD that are present, the command decoder 10 outputs a command signal BS to the control unit 8 which specifies that a termination needs to be undertaken with the first resistance value RTT_Nom (with the termination signal TermEn activated), and in the case of a second group of control commands the command decoder 10 outputs a command signal BS to the control unit 8 which specifies that the terminal 4 is to be terminated with a second resistance value (with the termination signal TermEn activated). The first group of control commands can comprise control commands that, for example, indicate a deactivation of the integrated circuit, or a read access to the integrated memory circuit, while the second group of control commands can indicate write commands to the integrated memory circuit.

The time duration between the applying of a control command signal or between the making available of the command signal BS to the control unit 8 and changes, dependent thereon, to the resistance value in the termination circuit 5 may be established as first switchover time ODTLCNW that may be equal to or less than the termination switch-on time ODTLon.

In general, the control unit 8 may essentially switch on simultaneously the termination and the corresponding setting of the terminating resistor to the corresponding resistance value. Furthermore, it is likewise possible for the termination to be switched off and the resistance value to be changed simultaneously.

Furthermore, it can be provided, for example, when a control command of the second group of control commands is present that after the lapse of a second switchover time ODTLCWN the control unit 8 changes the termination of the second resistance value to the first resistance value irrespective of whether the termination signal TermEn provides a termination or not. The second switchover time ODTLCWN corresponds at least to a time duration that is determined by the ending of the write access or by the ending of an access to the memory chip that is triggered by a control command of the second group of control commands. In the case of a burst write access as described in conjunction with FIG. 4, the second switchover time should be a function of the write latency time WL and of the time duration for the burst access. Alternatively, the second switchover time can also be set as a function of the end of a data transfer from and to the memory chip 1. The second switchover time ODTLCBM may be the sum of the write latency WL, and the duration of the burst access (burst length/2*clock cycle length TCK) plus a safety period (½*TCK or a multiplier thereof). It is possible in this way for the second resistance value RTT_WR for terminating the terminal to be made available for terminating the terminal only for a specific time duration as a function of a control command CMD that is present, the terminal being terminated again after the elapse of this time duration with the first resistance value if the latter is specified by the termination signal TermEn.

Figure 5:
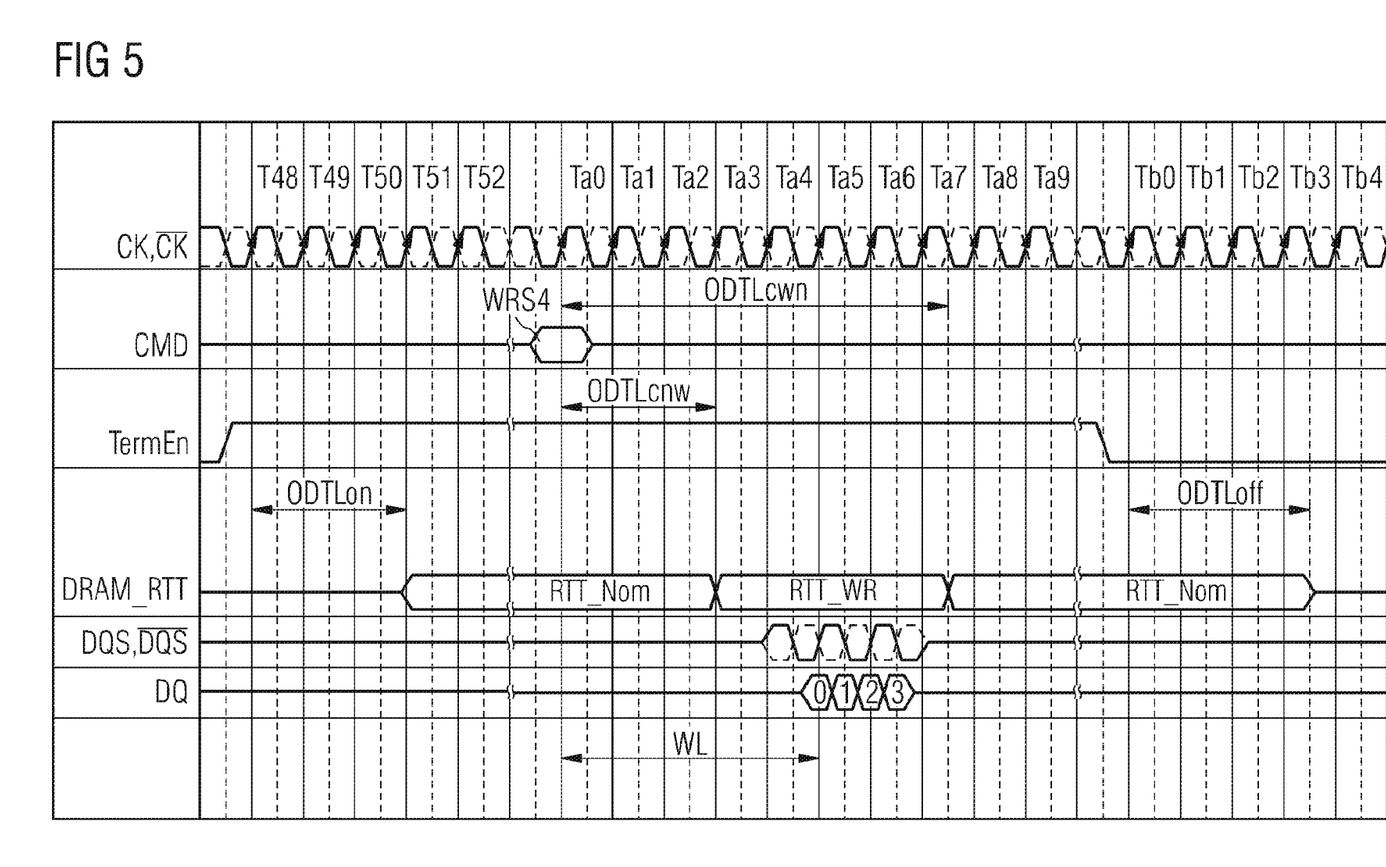
FIG. 5 shows a signal-time diagram for illustrating the functionality of the embodiments of FIGS. 1 and 2 that illustrates the carrying out of a write operation in conjunction with an activated termination signal.

Referring to FIG. 5, an embodiment, is shown in which the termination signal TermEn permits the termination of the terminal 4 to be switched on before, during and after a write access WRS4, the termination being set before the write access to the first resistance value RTT_Nom. After the elapse of the first switchover time ODTLCNW the terminal 4 is terminated with the resistance value RTT_WR, and after the elapse of the second switchover time ODTLCWN, the termination is switched back again to the first resistance value RTT_Nom.

While in the exemplary embodiment shown in FIG. 1 only two different terminating resistors can be connected to the external terminal 4, the number of different settable terminating resistors can, however, be as high as desired. Accordingly, different terminating resistors can be connected to the external terminals for different accesses in a memory system in which the memory chip is operated.

According to one aspect of the invention, during the operation of the memory chips in a memory system the terminating resistors can be specifically set for each of the memory chips as a function of the operation currently being carried out. Thus, it is possible to provide different terminating resistors that can individually, or else in combination, be connected to the external terminal. It can be possible, in addition, to apply a terminating resistor to the external terminal as a function of a termination signal TermEn.

In summary, a memory chip for setting various terminations is provided on a signal line of the data bus. The memory chip comprises a terminal, a termination circuit that can be connected to the terminal in order to terminate the terminal with a settable resistance value, a control command port for receiving a control command signal, and a control circuit that is connected to the termination circuit in order to set the resistance value as a function of a received control command signal and to make it available at the terminal.

The memory chip renders it possible to set a resistance value of the termination circuit as a function of a control command connected to the memory chip, and to terminate the terminal in an improved way such that the data transmission via the memory bus, which can be connected to the memory chip in a memory system, is supported in an optimal way. It is possible in this way to set the terminating resistor directly as a function of the operation of the memory system without the need to store a configuration value in the memory chip immediately before carrying out the operation by a corresponding setting operation controlled by the memory controller. It is advantageous that the setting of the respective termination need not be controlled by a memory controller of the memory system, but is prescribed by the control command signals in the memory system.

The termination circuit can further have a number of terminating resistors in order to provide a number of various resistance values, the control circuit being fashioned in order to select at least one of the terminating resistors and apply it to the terminal. By providing the number of the terminating resistors in the memory chip, the corresponding terminating resistors can be selected relatively quickly such that there is no, or no substantial time loss in carrying out the operation in the memory system.

In accordance with a further embodiment, a configuration unit is provided in order to set the resistance values of the number of terminating resistors. It is thereby possible to preselect the resistance values with which the terminal can be terminated.

In accordance with a further embodiment, the termination circuit can comprise a settable terminating resistor, a setting circuit being provided in order to make available as a function of a selection signal a setting value with the aid of which the resistance value of the terminating resistor is determined.

The memory chip further has a termination port in order to receive a termination signal, the control circuit being connected to the termination circuit in order, as a function of the termination signal either to terminate the terminal with the set resistance value, or not to terminate the terminal. It is possible in this way optionally also not to provide any termination at the terminal when this is prescribed by the memory controller and/or a control command.

The control circuit can further be connected to the termination circuit in order as a function of the termination signal to terminate the terminal with the set resistance with a first time delay in each case, or not to terminate it in accordance with a second time delay, the first time delay sufficing in order to set the resistance value. The first and the second time delays can be the same or different.

The control unit can further be fashioned such that the resistance value is set to a specific second resistance value as a function of the presence of a control command signal after a predetermined first switchover time and/or is set to a specific first resistance value after a predetermined second switchover time.

In accordance with a further embodiment, the control circuit sets the first switchover time as a function of the first time delay, and/or sets the second switchover time as a function of the second time delay.

In particular, the control unit can be fashioned such that the resistance value is set to the second resistance value in a fashion substantially simultaneous with the appliance of the termination at the terminal, and/or is set to the first resistance value in a fashion substantially simultaneous with the ending of the termination of the terminal.

In accordance with a further embodiment, a command decoder can be provided in order as a function of a control command signal that is present to communicate to the control unit whether a first or a second resistance value is to be set for termination.

In accordance with a further aspect, a memory system is provided having a memory controller, with a number of inventive memory chips and having a memory bus to which the memory controller and the memory chips are connected, the memory bus comprising a signal line that interconnects the terminals of the memory chips and a terminal of the memory controller.

In accordance with a further aspect, a method is provided for operating a memory chip in the case of which a control command signal is received, in which a terminal is terminated with a settable resistance value, and the resistance value is set as a function of the received control command signal, and the terminal is terminated with the set resistance value. It is possible in this way to set the terminating resistor, which is connected to a terminal of a memory chip, as a function of a control command such that it is possible during operation of the memory chip in a memory system to set the termination suitable for operations to be carried out at each of the memory chips in order to reduce signal reflections on the lines of the memory bus, and thus to increase the possible data transmission rate. It is also advantageous that the setting of the resistance value can be carried out without providing further signals to be connected from outside.

The resistance value can further be set by the selection of a setting value for a settable terminating resistor.

The method further includes setting the resistance value by selection from a number of terminating resistors that are connected to the terminal.

In accordance with a further embodiment, it is possible to receive a termination signal and, as a function of the termination signal, either the terminal with the set resistance value is terminated, or the terminal is not terminated.

In accordance with a further embodiment, it is possible as a function of a change in level of the termination signal either to switch on the termination with the set resistance value with a time delay, or to switch off the termination with the time delay, the time delay being selected such that the selected terminating resistor can be set.

While the foregoing is directed to embodiments of the present invention, other and further embodiments of the invention may be devised without departing from the basic scope thereof, and the scope thereof is determined by the claims that follow.

What is claimed is:

1. A memory chip for variably setting terminations, comprising:
   a terminal;
   a termination circuit coupled to the terminal and configured to terminate the terminal according to a settable resistance value;
   a control command port for receiving a control command signal for affecting accessibility of the memory chip;
   a control circuit connected to the termination circuit and configured to set the resistance value as a function of the received control command signal; and
   a termination port to receive a termination signal, wherein the control circuit is configured to selectively terminate the terminal with the set resistance value in response to the termination signal,
   wherein the control circuit, as a function of the termination signal, selectively performs one of: (i) terminates the terminal with the set resistance value after a first time delay; and (ii) does not terminate the terminal in accordance with a second time delay, the first time delay being sufficiently long to set the resistance value.

2. The memory chip of claim 1, wherein the control circuit is configured such that, as a function of the received control command signal, the resistance value is set to a first resistance value after a first predetermined switchover time and is set to a second resistance value after a second predetermined switchover time.

3. The memory chip of claim 2, wherein the control circuit sets the first switchover time as a function of the first time delay, and sets the second switchover time as a function of the second time delay.

4. The memory chip of claim 3, wherein the control circuit sets the resistance value to the first resistance value as a function of the control command signal substantially simultaneously with the switching on of the termination of the terminal, and sets the resistance value to the second resistance value substantially simultaneously with the ending of the termination of the terminal.

5. A system, comprising:
(a) a memory controller having a terminal;
(b) a plurality of memory chips, at least one of the memory chips comprising:
a terminal;
a termination circuit connectable with the terminal and configured to terminate the terminal according to a settable resistance value;
a control command port for receiving a control command signal for affecting accessibility of the memory chip; and
a control circuit connected to the termination circuit and configured to set the resistance value as a function of the received control command signal;
(c) a memory bus comprising a signal line interconnecting the terminals of the memory chips and the terminal of the memory controller; and
(d) a termination port to receive a termination signal, wherein the control circuit is configured to selectively terminate the terminal of the respective memory chip with the set resistance value in response to the termination signal,
wherein the control circuit, as a function of the termination signal, selectively performs one of: (i) terminates the terminal of the respective memory chip with the set resistance value after a first time delay; and (ii) does not terminate the terminal of the respective memory chip in accordance with a second time delay, the first time delay being sufficient to set the resistance value.

6. The system of claim 5, wherein the control circuit is configured such that, as a function of the received control command signal, the resistance value is set to a first resistance value after a first predetermined switchover time and is set to a second resistance value after a second predetermined switchover time.

7. The system of claim 6, wherein the control circuit sets the first switchover time as a function of the first time delay, and sets the second switchover time as a function of the second time delay.

8. The system of claim 7, wherein the control circuit sets the resistance value to the first resistance value as a function of the control command signal substantially simultaneously with the switching on of the termination of the terminal of the respective memory chip, and sets the resistance value to the second resistance value substantially simultaneously with the ending of the termination of the terminal of the respective memory chip.

9. A method for operating a memory chip, comprising:
receiving a control command signal for affecting accessibility of the memory chip;
setting a resistance value for a terminal as a function of the control command signal;
terminating the terminal with the resistance value, wherein terminating comprises at least one of: beginning the terminating after a first time delay relative to the termination enable signal and stopping the terminating after a second time delay relative to the termination enable signal, the first time delay being selected such that the selected terminating resistor can be set; and
receiving a termination enable signal, the presence of which is required for the terminating to occur.

10. The method of claim 9, further comprising:
changing the resistance value after a predetermined first switchover time relative to receiving a predetermined command represented by the control command signal; and
terminating the terminal with the changed resistance value.

* * * * *